(12) United States Patent
Clark

(10) Patent No.: US 12,307,029 B2
(45) Date of Patent: May 20, 2025

(54) LATENCY COMPENSATION SYSTEM

(71) Applicant: SONUUS LIMITED, St Neots (GB)

(72) Inventor: James Hastings Clark, St Neots (GB)

(73) Assignee: SONUUS LIMITED, St Neots (GB)

( * ) Notice: Subject to any disclaimer, the term of this patent is extended or adjusted under 35 U.S.C. 154(b) by 0 days.

(21) Appl. No.: 18/252,410

(22) PCT Filed: Nov. 1, 2021

(86) PCT No.: PCT/EP2021/080278
§ 371 (c)(1),
(2) Date: May 10, 2023

(87) PCT Pub. No.: WO2022/101046
PCT Pub. Date: May 19, 2022

(65) Prior Publication Data
US 2024/0045519 A1 Feb. 8, 2024

(30) Foreign Application Priority Data

Nov. 11, 2020 (GB) ...................... 2017797

(51) Int. Cl.
A63F 13/24 (2014.01)
G06F 3/01 (2006.01)
(Continued)

(52) U.S. Cl.
CPC .......... *G06F 3/0362* (2013.01); *G06F 3/0202* (2013.01); *A63F 13/24* (2014.09)

(58) Field of Classification Search
CPC ....... G06F 3/0362; G06F 3/0202; A63F 13/24
See application file for complete search history.

(56) References Cited

U.S. PATENT DOCUMENTS 11,150,741 B1 * 10/2021 Stoeckli ................ H01H 9/167
2011/0102326 A1 * 5/2011 Casparian .............. H01H 13/85
340/407.2
(Continued)

FOREIGN PATENT DOCUMENTS

CN 103455151 B * 5/2017 .......... G06F 3/0202
GB 2569578 A 6/2019
(Continued)

OTHER PUBLICATIONS

International Search Report issued in Intl. Appln. No. PCT/EP2021/080278 mailed Jan. 24, 2022.
(Continued)

*Primary Examiner* — Lin Li
(74) *Attorney, Agent, or Firm* — ROSSI, KIMMS & McDOWELL LLP

(57) ABSTRACT

A method and corresponding system for providing a depressed state signal from a keyboard or button. The method comprises sensing movement of an actuator of the keyboard or button, determining, during depression of the actuator, a velocity of the actuator at a depression sense position of the actuator and at a first time, processing the determined velocity to predict when the actuator will reach a second depression sense position of the actuator at a later point during depression of the actuator, and generating the depressed state signal with a timing based on the prediction of when the actuator will reach the second depression sense position. A complementary method and system provides a released state signal.

20 Claims, 9 Drawing Sheets

(51) Int. Cl.
*G06F 3/02* (2006.01)
*G06F 3/0362* (2013.01)
*G06F 3/041* (2006.01)
*H01H 9/16* (2006.01)
*H01H 13/85* (2006.01)
*H10N 30/20* (2023.01)

(56) References Cited

U.S. PATENT DOCUMENTS

| | | | |
|---|---|---|---|
| 2013/0207793 A1* | 8/2013 | Weaber | G06F 3/041 340/407.2 |
| 2015/0059557 A1 | 3/2015 | Sakata et al. | |
| 2015/0371619 A1 | 12/2015 | Uehara | |
| 2018/0120938 A1* | 5/2018 | Frescas | H10N 30/2042 |
| 2018/0338026 A1* | 11/2018 | Jon | H04M 1/576 |
| 2020/0320966 A1* | 10/2020 | Clark | G10H 1/344 |
| 2021/0048894 A1* | 2/2021 | Wang | G06F 3/016 |
| 2021/0294431 A1 | 9/2021 | Clark et al. | |
| 2022/0008821 A1* | 1/2022 | Khim | A63F 13/24 |

FOREIGN PATENT DOCUMENTS

| | | | | |
|---|---|---|---|---|
| JP | 2017097374 A | 6/2017 | | |
| WO | WO 2019/122867 A1 * | 6/2019 | | G10H 1/344 |
| WO | 2020030911 A1 | 2/2020 | | |

OTHER PUBLICATIONS

Written Opinion issued in Intl. Appln. No. PCT/EP2021/080278 mailed Jan. 24, 2022.
Moro. "Beyond Key Velocity: Continuous Sensing for Expressive Control on the Hammond Organ and Digital Keyboards." University of London Degree of Doctor on Philosophy, School of Electronic Engineering and Computer Science, Queen Mary University of London. May 2020: 1-267. Online. Retrieved on Jan. 13, 2022. URL: https://qmro.qmul.ac.uk/xmlui/bitstream/handle/123456789/67082/Moro_G_PhD_final_120520.pdf?sequence=1&isAllowed=y.
Moro. "A platform for low-latency continuous keyboard sensing and sound generation." NIME'20. Jul. 25, 2020: 1-6. Online. URL: https://qmro.qmul.ac.uk/xmlui/bitstream/handle/123456789/64180/Moro%20A%20platform%20for%20low%202020%20Published.pdf?sequence=2&isAllowed=y>.

* cited by examiner

LATENCY COMPENSATION SYSTEM

FIELD

Embodiments relate to a latency compensation system for input devices such as musical keyboards, computer keyboards, computer mice and gaming controllers.

BACKGROUND

Many systems comprise an input device responsive to an input stimulus whereby an actuation event is generated in response to said input stimulus and said actuation event causes transmission of a trigger signal to an output device to produce a desired outcome.

Examples of such systems include systems with input devices responsive to actuation by a human operator such as: electronic musical instruments wherein the input device is a sensor on a musical keyboard; computer keyboards wherein the input device is a switch in a key; electronic gaming controllers wherein the input device is a switch or a joystick; computer mice wherein the input device is a mouse button; weapons wherein the input device is a trigger.

Further examples of such systems include systems with input devices responsive to a mechanical action not involving an operator such as: machine tools wherein the input device is an end-point detector; robots wherein the input device is an excursion detector.

However, these aforedescribed systems have a time delay, hereinafter referred to as latency, between the onset of the actuation event and the result of the desired outcome at an output device. The sources of said latency include but are not limited to: the time taken for an input device to transition from its inactive state to its active state following an actuation event; the time taken for transmission of a trigger signal from said input device to said output device; the time to respond to said trigger signal by said output device to produce said desired outcome.

As an illustrative example, take the case of a switch on an electronic game controller coupled to an electronic computer game. Once said switch has been pressed there is a delay before the actuation event is detected, which is typically 1-10 ms. Thereafter a trigger signal is transmitted to said electronic computer game, for example via an RF protocol such as Bluetooth® or a wired connection such as Universal Serial Bus, which adds a further minimum delay of typically 1-4 ms. Thus the fastest response time of said electronic computer game to pressing of said switch is limited by a latency of 2-14 ms. Reducing this latency would be helpful to a computer game player.

There is therefore a desire in many systems to reduce the latency between an actuation event and the desired outcome.

Several methods have previously been used to reduce this latency including using fast-moving optical switches that remove the switch bounce of mechanical switches and low-latency transmission protocols. The inventor has realised that although such methods can reduce latency they have disadvantages and may be only partially effective.

SUMMARY

According to a first aspect there is provided a method, and corresponding system, for providing a depressed state signal from a keyboard or button. The method may comprise sensing movement of an actuator of the keyboard or button. The method may comprise determining, during depression of the actuator, a velocity of the actuator at a depression sense position of the actuator and at a first time. The method may comprise processing the determined velocity to predict when the actuator will reach a second depression sense position of the actuator at a later point during depression of the actuator. The method may comprise generating the depressed state signal with a timing based on the prediction of when the actuator will reach the second depression sense position.

The prediction of when the actuator will reach the second depression sense position may be based on a predicted depression time i.e. a time at which the actuator is predicted to reach the second depression sense position.

The depressed state signal may be a signal sent from the keyboard or button that indicates to an output device that the actuator has been depressed. Therefore, the depressed state signal may comprise a control signal. The depressed state signal may be processed by the output device and the output device performs an action accordingly. For example, a keyboard or button may be connected to a computing device (the computing device is an example of an output device), and the depressed state signal indicates to the computing device that the computing device perform an action e.g. print an alphanumeric character via a word processing program. In a further example, the keyboard or button may be connected to a sound generation device (for example, a musical keyboard, or an electric drum kit), and the depressed state signal may indicate to the sound generation device to start sounding a musical sound output e.g. note. The depression state signal may be communicated via a wired or wireless connection between the keyboard or button and the output device. The keyboard or button may be part of the same device as the output device.

Sensing movement of the actuator may be performed in a variety of ways, some of which are described below. Methods of sensing movement of the actuator include an electronic sensor, a mechanical sensor, optical switches, and so forth.

The actuator may be a component part of the keyboard or button. For example, the actuator may include a key face of a keyboard, a button top of a button, or a further (e.g. internal) component of the keyboard or button. Regardless of whether the actuator is considered to be a part of the keyboard or button directly in contact with, for example, a user's finger, the actuator is configured to be depressed in response to a user input.

The depression sense position of the actuator may be considered to be a position of the actuator at a point in time when the velocity of the actuator is determined. The first time corresponds to a time when the actuator is at the depression sense position (this may be considered to be the 'first' depression sense position). For example, the velocity of the actuator may be determined momentarily after a user depresses the actuator and the depression sense position corresponds to the position when the velocity is determined.

The second depression sense position is a position of the actuator at a later point in time compared to the first time. The actuator may be more depressed when at the second depression sense position than when the actuator is at the (first) depression sense position. For example, the actuator may be in connection with a biasing means configured to bias the actuator towards a released position. A user depresses the actuator and the actuator reaches the (first) depression sense position, the actuator is depressed further and the actuator moves towards the second depression sense position. The user may expect the actuator to cause the keyboard or button to provide a depression state signal at a point in time when the actuator reaches the second sense position. The user may expect the output device to have processed an action associated with the depression state signal at a point in time when the actuator reaches the second sense position.

By generating the depressed state signal with a timing based on the prediction of when the actuator will reach the second depression sense position, latency is reduced because the depressed state signal is sent earlier than would be sent in a known system or known method.

By generating the depressed state signal with a timing based on the prediction of when the actuator will reach the second depression sense position, rather than when the actuator physically reaches the second depression sense position, latency is reduced.

According to a second, related aspect there is provided a method, and corresponding system, for providing a released state signal from a keyboard or button. The method may comprise sensing movement of an actuator of the keyboard or button. The method may comprise determining, during release of the actuator, a velocity of the actuator at a release sense position of the actuator and at a first release time. The method may comprise processing the determined velocity to predict when the actuator will reach a second release sense position of the actuator at a later point during release of the actuator. The method may comprise generating the released state signal with a timing based on the prediction of when the actuator will reach the second release sense position.

The prediction of when the actuator will reach the second release sense position may be based on a predicted release time, i.e a time at which the actuator is predicted to reach the second release sense position.

The released state signal may be a control signal sent from the keyboard or button that indicates to an output device that the actuator has been released. Therefore, the released state signal may comprise a control signal. The released state signal may be processed by the output device and the output device performs an action accordingly. For example, a keyboard or button may be connected to a computer, and the released state signal indicates to the computer to stop printing a character via a word processing program. In a further example, the keyboard or button may be connected to a sound generation device (for example, a musical keyboard, or an electric drum kit), and the released state signal indicates to the sound generation device to stop sounding a musical note. The released state signal may be communicated via a wired or wireless connection between the keyboard or button and the output device. The keyboard or button may be part of the same device as the output device.

Sensing movement of the actuator may be performed in a variety of ways, some of which are described below. Methods of sensing movement of the actuator include an electronic sensor, a mechanical sensor, optical switches, and so forth.

The actuator may be a component part of the key or button. For example, the actuator may be a key face of a keyboard, a button top of a button, a further component of the key or button, or a further (e.g. internal) component of the keyboard or button. Regardless of whether the actuator is considered to be a part of the keyboard or button directly in contact with, for example, a user's finger, the actuator is configured to be released in response to a user input, for example, a user releasing their finger from a keyboard or button.

The release sense position of the actuator may be considered to be a position of the actuator at a point in time when the velocity of the actuator is determined. The first time corresponds to a time when the actuator is at the release sense position. For example, the velocity of the actuator may be determined momentarily after a user releases the actuator and the released sense position corresponds to the position when the velocity is determined.

The second release sense position is a position of the actuator at a later point in time compared to the first time. The actuator may be further released (i.e. less depressed) when at the second release sense position than when the actuator is at the (first) release sense position. For example, the actuator may be in connection with a biasing means configured to bias the actuator towards a released position. The actuator may have been depressed by a user and subsequently the user releases the actuator, the actuator moves in response to the release by the user and the actuator reaches the (first) release sense position. The actuator continues towards the second release sense position. The user may expect the actuator to cause the keyboard or button to provide a release state signal at a point in time when the actuator reaches the second release sense position. The user may expect the output device to have processed an action associated with the released state signal at a point in time when the actuator reaches the second release sense position.

By generating the released state signal with a timing based on the prediction of when the actuator will reach the second release sense position, latency is reduced because the released state signal is sent earlier than would be sent in a known system or known method. By generating the released state signal with a timing based on the prediction of when the actuator will reach the second release sense position, rather than when the actuator physically reaches the second release sense position, latency is reduced.

Some of the capabilities of the above aspects may be combined in a single keyboard, key or button. For example, the actuator of e.g. a key/keyboard or button may be provided with the capability to generate both the released state signal and the depressed state signal.

The keyboard or button may be referred to as an input device. The actuator may be a key of the keyboard, or a moving component of a key mechanism. The actuator may be a button top of the button. In other words, the actuator may be an element configured to move in response to an input stimulus, such as a user's touch.

The actuator may comprise a detection element, where the detection element is a specific part of the actuator that is being sensed.

The second depression sense position may be referred to as an actuation event or a detection threshold or an actuation point. The second depression sense position can be fixed or can be adjusted (e.g. by a user).

The second release sense position may be referred to as an actuation event or a detection threshold or an actuation point. The second release sense position can be fixed or can be adjusted (e.g. by a user).

The actuator may move from the (first) depression sense position to the second depression sense position along an axis. Such an axis may be referred to as an axis of motion. The actuator may move from the (first) release sense position to the second release sense position along an axis, such an axis may be referred to as an axis of motion.

The keyboard or button may be connected to an output device. The keyboard or button may be configured to control the output device. For example, the keyboard or button may be configured to control a desired outcome of the output device, where the desired outcome could, for example be a selection on a computer, a deselection on a computer, a generation of a musical note, an end of an output of a musical note, a movement of a character of a computer game.

The keyboard or button may be responsive to an input stimulus such as a depression or release of the keyboard or button. The input stimulus may be referred to as an external stimulus because the stimulus originates from something outside of the bounds of the keyboard or button. For example, the external stimulus could be a user's touch, a user depressing the key or button, a user clicking a button on a computer mouse, and so forth.

The actuator may be referred to as a detection element. This is because is it the position and/or velocity of the actuator that is sensed. The position and/or velocity of the actuator therefore varies in response to an input stimulus, such as a user pressing down or releasing the actuator. A repeated input stimuli may be when the actuator is repeatedly depressed and released.

The actuator may be considered to be in an inactive state before the actuator reaches the second release sense position or the second depression sense position.

The actuator may be considered to be in an active state once the actuator reaches or goes beyond the second release sense position or the second depression sense position. After this occurs, the actuator can ordinarily only return to an inactive state once the actuator passes a deactivation point. To reach the deactivation point, the actuator moves away from the second release sense position or the second depression sense position. In other words, if an actuator is depressed and subsequently switches from an inactive state to an active state, the actuator can then move back to an inactive state once the actuator is released and returns to (or past) the deactivation point.

The actuator may be considered to be in an intermediate position when the actuator is positioned between the actuation point and the deactivation point.

The keyboard or button may comprise an end stop for the actuator. The end stop prevents the actuator from being depressed past an end stop position.

When the actuator is in a fully released position, the actuator may be referred to as being in a start position.

The keyboard may comprise multiple keys. In such embodiments, at any given time, some of the keys could be in an active state whilst other keys could be in an inactive state.

A trigger event may be used to describe the depressed state signal or the released state signal. Similarly, trigger signal may be used to describe the depressed state signal or the released state signal.

The term 'pre-actuation location' may be used to refer to the (i.e. first) release sense position or the (i.e. first) depression sense position. Other pre-actuation locations are possible, such as: a position between the (first) depression sense position and the second depression sense position; a position between the (first) release sense position and the second release sense position; a position that is further away from the second depression sense position than the (first) depression sense position; and a position that is further away from the second release sense position than the (first) release sense position.

A time at which the actuator is at a position (e.g. release sense position or the depression sense position, second release sense position, second depression sense position) may be referred to as a timestamp.

The generated depressed state signal or released state signal may be generated or sent at a trigger event time. The generated depressed state signal or released state signal may be generated or sent when the actuator reaches a trigger threshold position.

The movement may be sensed by, for example, an electronic sensor, a mechanical sensor, optical switches, and so forth. Timestamps may be recorded when a movement and/or position of the actuator is sensed.

The term actuator may be used to describe the key or button element. Actuator encompasses other components, such as a trigger or a gaming joystick.

The keyboard or button of the first and/or second aspect may control an action of an output device in response to the actuator reaching the second depression sense position or second release sense position. The method of the first and/or second aspect may comprise obtaining an indication of a latency value of the output device. The timing of the method of the first and/or second aspect may be further based on the latency value such that a time delay between the actuator reaching the second depression sense position or second release sense position and the action occurring is a latency reduction period time. The term 'outcome time' may be used to refer to a time when the action occurs. The latency reduction period may be set by a user.

The timing may be such that the latency reduction period is substantially zero.

In some implementations, even if the switch itself were to achieve zero latency, the latency in other parts of the system such as the transmission, reception and processing of the trigger signal is still present. Some implementations of the method and system may also remove these sources of latency.

The method of the first and/or second aspect may comprise determining the latency value by performing one or more of: receiving an indication of a depression time or a release time at which the actuator reaches the second depression sense position or second release sense position; receiving an indication of an action time. In implementations the action time may corresponds to a time when the action is triggered or occurs at the output device. The method may include determining a difference between: the depression time or release time; and the action time.

The sensing of the first and/or second aspect may be performed by two or more sensors. Each sensor may be at a fixed position. The velocity of the first and/or second aspect may be determined by processing: a time associated with the actuator being sensed at each of the fixed positions; and a known distance between each of the two or more sensors.

The sensing of the first and/or second aspect may be performed at a succession of times. The velocity of the first and/or second aspect may be determined by processing the sensed position of the actuator at each time of the succession of times.

Determining the velocity of the first and/or second aspect may comprise processing three or more sensed positions and associated times to determine an average velocity of the actuator.

The method of the first and/or second aspect may comprise determining, after generating the depressed state signal or the released state signal, a first retrigger velocity of the actuator and a subsequent second retrigger velocity of the actuator. The method of the first and/or second aspect may comprise, generating a retrigger signal in response to determining that: the first retrigger velocity is such that the actuator is moving away from the second depression sense position or second release sense position at a first threshold rate; and the second retrigger velocity is such that the actuator is moving towards the second depression sense position or second release sense position at a second threshold rate. The first threshold rate may be referred to as a negative threshold. The second threshold rate may be referred to as a positive threshold.

The method of the first and/or second aspect may comprise determining, after generating the depressed state signal or the released state signal, an inversion position where the actuator is determined to be moving towards the actuation position. The method of the first and/or second aspect may comprise, in response to determining that the actuator has moved a beyond the inversion position by a retrigger threshold distance, generating a retrigger signal.

In some known systems, when the input device is subject to repeated input stimuli, the input device must transition repeatedly between its inactive state and its active state in order to allow transmission of correspondingly repeated trigger signals to the output device. The additional time delay caused by the condition to transition from said active state to said inactive state is the retrigger latency and this reduces the rate at which said trigger signals may be sent to said output device. Implementations of the described methods and systems can reduce this.

According to a third aspect there is provided a method, and corresponding system, of controlling an action of an output device in response to an actuator of an input device reaching an actuation position. The method may comprise sensing movement of the actuator. The method of the third aspect may further comprise determining a velocity of the actuator by processing a signal representing the sensed movement. The method of the third aspect may further comprise processing the determined velocity to output a control signal to the output device at an output time no later than a time when the actuator reaches the actuation position.

The method of the third aspect may comprise processing the determined velocity to output a control signal to the output device at an output time that is earlier than a time when the actuator reaches the actuation position.

The method of the third aspect may comprise processing the determined velocity to determine a time when the actuator is predicted to reach the actuation position. The method of the third aspect may comprise processing the determined velocity to output a control signal to the output device at an output time that is earlier than a time when the actuator is predicted to reach the actuation position. The method of the third aspect may comprise processing the determined velocity to output a control signal to the output device at an output time no later than a time when the actuator is predicted to reach the actuation position.

Similarly to the related first and second aspects, the actuator of the third aspect may be a key of a keyboard, a button top of a button, a trigger of a weapon, etc. The method of controlling may be a method of control by a user, for example a user pulling a trigger or a user depressing a key of a keyboard.

The method of controlling the action may involve controlling a generation of a musical note, moving a character of a video game, or making a selection on a computer. For example, the input device may be a keyboard or button and the method of controlling may relate to controlling a computer (e.g. a PC, games console, etc.) in connection with the keyboard or button, the action may be a moving of an avatar in a video game being played using the computer (and further using the keyboard or button), for example.

The processing of the signal representing the sensed movement may be performed in many ways, some of which are described below with reference to the figures.

The control signal may be a signal to confirm a selection of an action performed on a computer (e.g. a click of a mouse connected to a personal computer). In other instances, the control signal may be a signal to cease a selection on a computer (e.g. a ceasing of a click of a mouse connected to personal computer). The control signal may be a signal to generate a musical note, if, for example, the output device is a musical keyboard.

Advantageously, by outputting the control signal to the output device at an output time no later than a time when the actuator reaches the actuation position, the method decreases perceived latency for a user. This is because some of the latency caused by, for example, processing by the output device or transmission time of the control signal, can be counteracted and reduced by sending the control signal to the output device at an output time no later (e.g. earlier) than a time when the actuator reaches the actuation position. This is because the user may expect the control signal to control the output device at the time when the actuator reaches the actuation position. However, if the control signal is sent when the actuator reaches the actuation position or after the actuator reaches the actuation position, then delays (caused by, for example, processing at the output device, transmission time of the control signal, processing to sense that the actuator is at the actuation position, and so forth) can mean that the user may perceive that the output device has been controlled at a time later than when the actuator reaches the actuation position. By outputting the control signal to the output device at an output time no later than (for example, earlier than) a time when the actuator reaches the actuation position, such delays can be reduced and controlled (e.g. customised by a user). This can be viewed as a reduction in latency.

Where a keyboard is the input device then the actuator may be a key of the keyboard. Where a button (for example of a gaming controller) is the input device then the actuator may be a button top of the button. In other words, the actuator is an element configured to move in response to an input stimulus, such as a user's touch.

The actuator may comprise a detection element, where the detection element is a specific part of the actuator that is being sensed.

The actuation position may later be referred to as an actuation event or a detection threshold or an actuation point. The actuation position can be fixed or can be adjusted (e.g. by a user).

The actuator may be moveable along an axis, such an axis may be referred to as an axis of motion.

The actuator may be connected to an output device. The actuator may be configured to control the output device. For example, the actuator may be configured to control a desired outcome of the output device, where the desired outcome could, for example be a selection on a computer, a generation of a musical note, an end of an output of a musical note, a movement of a character of a computer game.

The actuator may be responsive to an input stimulus such as a depression or release of the keyboard or button, or movement of a joystick. The input stimulus may be referred to as an external stimulus because the stimulus originates from something outside of the bounds of the actuator. For example, the external stimulus could be a user's touch.

The actuator may be referred to as a detection element. This is because is it the position and/or velocity and/or movement of the actuator that is sensed. The position and/or velocity of the actuator therefore varies in response to an input stimulus, such as a user pressing down or releasing the actuator. A repeated input stimuli may be when the actuator is repeatedly depressed and released.

The actuator may be considered to be in an inactive state before the actuator reaches actuation position.

The actuator may be considered to be in an active state once the actuator reaches the actuation position. After this occurs, the actuator can ordinarily only return to an inactive state once the actuator goes past a deactivation point. To reach the deactivation point, the actuator moves away from actuation position. In other words, if an actuator is depressed and subsequently switches from an inactive state to an active state, the actuator can then move back to an inactive state if the actuator is released and returns to (or past) the deactivation point.

The actuator may be considered to be in an intermediate position when the actuator is positioned between the actuation point and the deactivation point.

The input device may comprise an end stop for the actuator. The end stop prevents the actuator from being depressed past an end stop position.

When the actuator is in a fully released position, the actuator may be referred to as being in a start position.

If the input device comprises multiple actuators, at any given time, some of the actuators could be in an active state whilst other actuators could be in an inactive state.

The term trigger event may be used to describe the control signal. Similarly, the term trigger signal may be used to describe the control signal.

The term pre-actuation location may be used to refer to a position of the actuator before the actuator reaches the actuation position. The pre-actuation location may be a position of the actuator when the movement of the actuator is sensed.

A time at which the actuator is at a position (e.g. a pre-actuation location or the actuation position, etc.) may be referred to as a timestamp.

The control signal may be generated or sent at trigger event time. The control signal may be generated or sent at when the actuator reaches a trigger threshold position.

The movement of the actuator may be sensed by, for example, an electronic sensor, a mechanical sensor, or optical switches. Timestamps may be recorded when a movement and/or position of the actuator is sensed.

The term actuator may be used to describe the key or button element. Actuator encompasses other components, such as a trigger or an element of a gaming joystick.

The method of the third aspect may comprise processing the velocity by: inputting the determined velocity into a model; and receiving, from the model, an indication of when the actuator will reach the actuation point. The method of the third aspect may comprise using the indication to determine the output time. The model may be a mathematical equation, examples of which are described below.

The method of the third aspect may comprise obtaining an indication of a latency value of the output device. The method of the third aspect may comprise processing the latency value to output the output signal at the output time such that a time delay between the actuator reaching the actuation position and the action occurring is a latency reduction period. The output time may be such that the latency reduction period is zero. The output time may be such that the latency reduction period is non-zero.

The method of the third aspect may comprise receiving an indication of an actuation time at which the actuator physically reaches the actuation position. The method of the third aspect may comprise receiving an indication of an action time. As previously described, the action time may correspond to a time when the action is triggered or occurs. The method of the third aspect may comprise determining a value of a latency between the actuation time and the action time.

The sensing of the third aspect may be performed by two or more sensors. Each sensor may be at a fixed position.

The method of the third aspect may comprise determining the velocity by processing: a time associated with the actuator being sensed at each of the fixed positions; and a known distance between each of the two or more sensors.

The sensing of the third aspect may be performed at a succession of times. The velocity may be determined by processing the sensed position of the actuator at each time of the succession of times.

Determining the velocity may comprise processing three or more sensed positions and associated times to determine an average velocity.

The method of the third aspect may comprise determining, after outputting the output signal, a second velocity of the actuator and a subsequent third velocity of the actuator. The method of the third aspect may comprise outputting a retrigger control signal to the output device in response to determining that: the second velocity is such that the actuator is moving away from the actuation position at a first threshold rate; and the third velocity is such that the actuator is moving towards the actuation position at a second threshold rate.

The method of the third aspect may comprise determining, after outputting the output signal and after the actuator has moved away from the actuation position, an inversion position where the actuator is determined to be moving towards the actuation position. The method of the third aspect may comprise, in response to determining that the actuator has moved beyond the inversion position by a retrigger threshold distance, outputting a retrigger control signal to the output device.

According to a fourth aspect, there is provided an input device for controlling an action of an output device in response to an actuator of the input device reaching an actuation position. The input device may comprise the actuator. The input device may comprise a sensor for sensing movement of the actuator. The input device may be configured to determine a velocity of the actuator by processing a signal representing the sensed movement. The input device may be configured to process the determined velocity to output a control signal to the output device at an output time no later than a time when the actuator reaches the actuation position.

There is therefore provided a latency compensation method and system to remove or adjust the latency between the actuation event of an input device and the desired outcome at an output device coupled to said input device. The said input device coupled to the said output device may be, for example: a switch or key coupled to a sound generator on a musical instrument; a key on a computer keyboard or mouse coupled to a computer program; a switch on a game controller coupled to a computer game; a trigger on a weapon system coupled to a firing mechanism; an end-point detection switch coupled to a control system on a machine tool.

The latency compensation system may comprise: an input device responsive to an input stimulus wherein said input device comprises a detection element whose position or output value, hereinafter referred to as position, varies in response to said input stimulus and a fixed or adjustable detection threshold, also known as the actuation point, before which said input device is deemed to be in the inactive state and beyond which said input device is deemed to be in the active state; a means of transmitting a trigger event to signal a change in the said active or said inactive state of said input device to an output device. The said input device may comprise a means of sensing the said position of said detection element relative to the said actuation point at two or more pre-actuation locations while said input device is in said inactive state and a means of determining a timestamp at these said two or more pre-actuation locations. The latency compensation system may comprise: a means of calculating, while said input device is in said inactive state, a future time at which said detection element's position equals said actuation point by using the sensed said detection element's positions and timestamps at said two or more pre-actuation locations; a means of calculating the time at which to transmit said trigger event to said output device, hereinafter referred to as the trigger event time, such that the time between when said detection element's position equals said actuation point and when said output device responds to said trigger event, the latency, is constrained to a prescribed range of values.

In embodiments of any of the above aspects, a determined change in velocity may be processed to determine the velocity of the actuator. Such embodiments may process a filtering coefficient. The filtering coefficient may be determined using a magnitude of the determined change in velocity. The filtering coefficient may be constrained to a range of values to avoid overflow/underflow of the average velocity. Such embodiments may be implemented in the digital domain. Advantageously, such embodiments provide improved resolution of the determined velocity because of the use of the filtering coefficient. This is especially advantageous for detecting a slow moving actuator (without significantly compromising the time response for a fast-moving actuator). Therefore, in embodiments, a higher extent of filtering can be applied for low velocities to obtain higher resolution, and a lower extent of filtering can be applied for high velocities to ensure the determined velocity closely tracks the physical velocity of the actuator (without causing a lag).

In embodiments, the two or more pre-actuation locations of the input device may be known locations corresponding to known positions of the detection element, wherein the timestamps at these said two or more pre-actuation locations corresponds to the time at which the detection element's position matches these known said positions. In implementations said pre-actuation locations may be defined by electronic, mechanical or optical switches whereby said timestamps are recorded when said switches are actuated.

In embodiments, the two or more pre-actuation locations of the input device may be determined at fixed times, for example by sampling the detection element's position at discreet time values, wherein the timestamp at these said two or more pre-actuation locations corresponds to the discreet time at which said detection element's position was sampled. In implementations said input device comprises a means of determining the position of said detection element relative to said actuation point, for example by incorporating an optical, capacitive, resistive, magnetic, or inductive position sensor.

In embodiments, the trigger event time is adjusted by the latency compensation system to maintain the latency value at a positive value.

In embodiments, the trigger event time is adjusted by the latency compensation system to maintain the latency value close to zero. In embodiments, the trigger event time is adjusted by the latency compensation system to maintain the latency value at zero.

In embodiments, the trigger event time is adjusted by the latency compensation system to maintain the latency value at a negative value.

In some implementations the actuation timestamp (the time at which the detection element's position equals the actuation point) and the outcome timestamp (the time at which the output device responds to the trigger event to produce a desired outcome) are both recorded and used to calculate the latency value. Said latency value is then used to adjust future trigger event times such that subsequent actuations of the input device maintain a consistent latency value. Such feedback may optionally include filtering to smooth the adjustment of the trigger event time, and/or statistical analysis to remove outlier values.

In embodiments, when the input device is subject to repeated input stimuli, after the input device has transitioned to the active state and a trigger signal has been transmitted to the output device, further trigger signals may be transmitted to said output device without said input device having to first transition back to the inactive state. In implementations such retriggering may be achieved by permitting changes in the velocity or the relative position of said input device's detection element that are above a threshold to generate said further trigger signals while said input device remains in said active state.

Embodiments of the present invention provide a system that can compensate for some, or all, of these aforementioned sources of latency in such a way that the latency between the time of an actuation event and the time of a desired outcome can be reduced.

According to an additional aspect, there is provided a method of providing a depressed state signal from a keyboard or button, the method comprising: sensing movement of an actuator of the keyboard or button; determining, during depression of the actuator, a velocity of the actuator based on pre-actuation positions of the actuator; processing the determined velocity to determine a trigger position; and generating the depressed state signal when the actuator reaches the trigger position.

The additional aspect may be combined with any one or more of the other aspects and/or any one of more of the optional features of the other aspects.

There is also provided processor control code e.g. stored on one or more computer readable media, to implement the methods and systems above. The code (computer program) may be provided on a non-transitory data carrier e.g. on one or more physical data carriers such as a disk or programmed memory such as non-volatile memory (eg Flash) or read-only memory (Firmware). Code and/or data to implement examples of the system/method may comprise source, object or executable code in a conventional programming language, interpreted or compiled), such as C, or assembly code, or code for a hardware description language. The code and/or data to implement the systems may be distributed between a plurality of coupled components in communication with one another.

DETAILED DESCRIPTION

Figure 1:
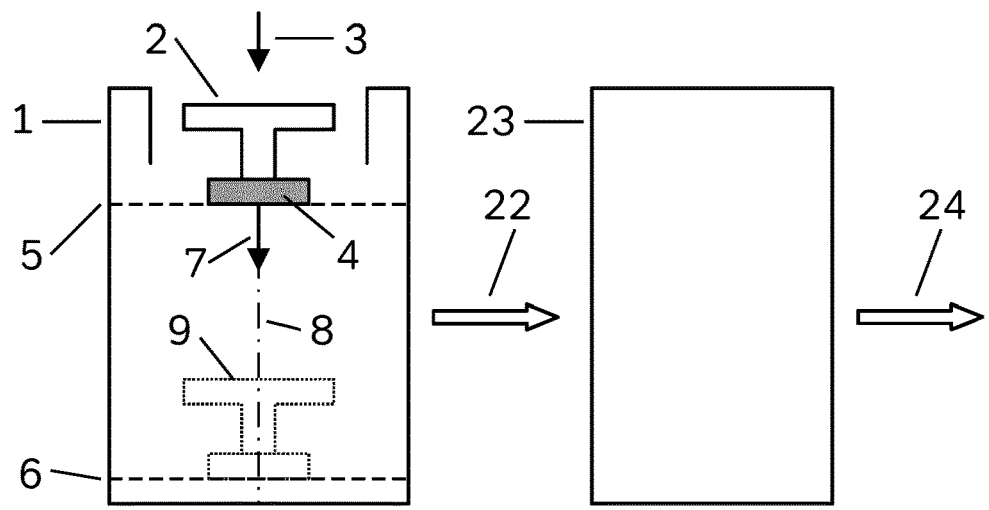
FIG. 1 shows an illustrative system as known in the art.

An illustrative system as known in the art is shown in FIG. 1, whereby an input device 1 comprises an actuator 2 and a detection element 4. In a resting state said detection element 4 is at a starting position 5. When acted upon by an external stimulus 3, said actuator 2 and said detection element 4 traverses a path in a direction 7 along an axis of motion 8. When said detection element's position equals the actuation point 6, and said actuator is in its final position 9, a trigger event is transmitted 22 to an output device 23 to signal that the input device has transitioned from the inactive state to the active state. Thereafter said output device produces a desired outcome 24.

Figure 2:
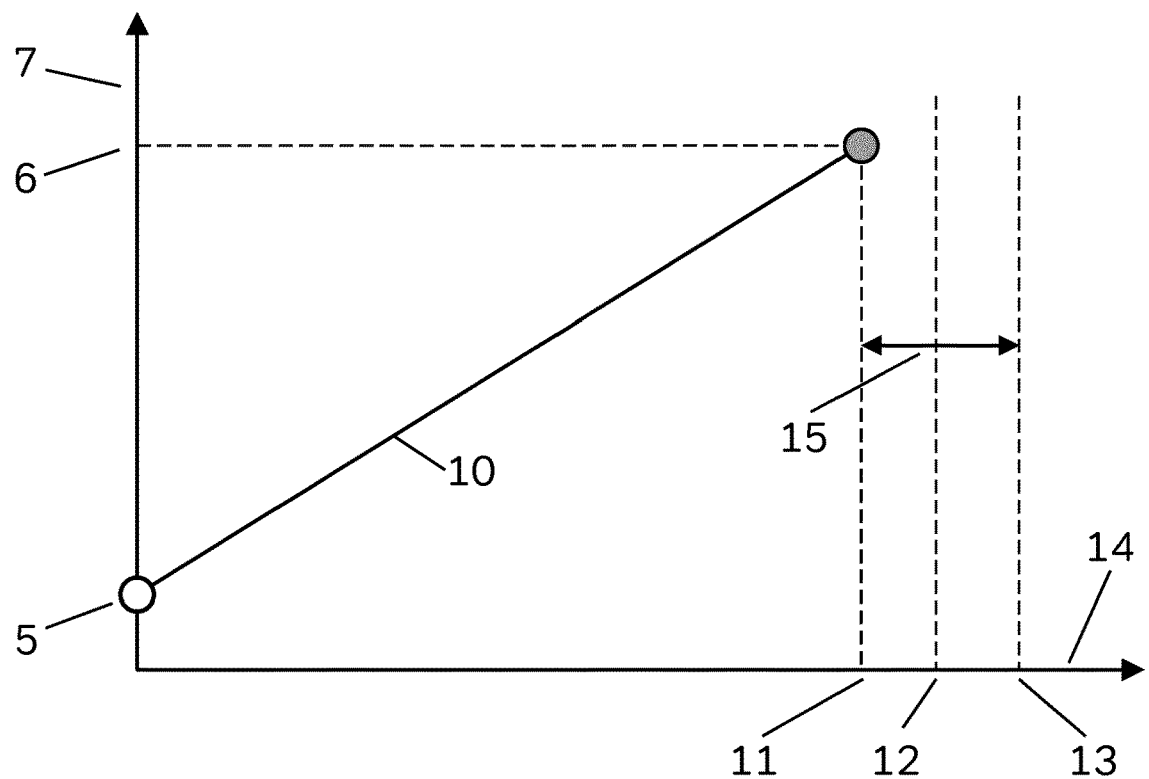
FIG. 2 shows a position versus time plot of the illustrative system shown in FIG. 1.

The causes of latency within the system shown in FIG. 1 are shown in FIG. 2. Referring to FIG. 2 which plots the variation of the detection element's position 7 against time 14 whereby said detection element 4 traverses a path 10 from the starting position 5 to the actuation point 6 at time 11 at which time a trigger event is transmitted to signal that the input device 1 has transitioned from the inactive state to the active state. Said trigger event is received by the output device 23 at time 12 and processed to produce the desired outcome at time 13. The said latency 15 is the difference in time between the time 13 (i.e. the time at which the desired outcome is produced) and the time 11 (i.e. the time at which the trigger event is transmitted).

Figure 3:
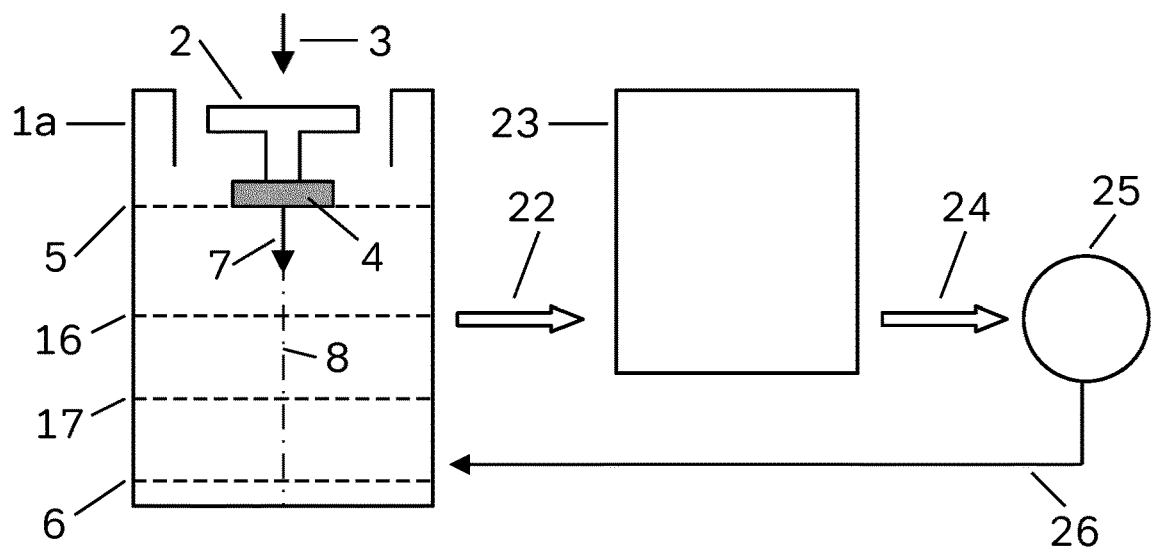
FIG. 3 shows an improved system according to an embodiment of the present invention.

According to an embodiment of the present invention, FIG. 3 shows an improved input device 1a (over that shown in FIG. 1 and FIG. 2) wherein two or more pre-actuation locations 16 and 17 are provided which permits the detection element's position and timestamp at each of these said pre-actuation locations to be determined prior to said detection element's position equalling the actuation point 6. Furthermore, a means of detecting an outcome time 13 at which a desired outcome occurs is optionally provided and said outcome time 13 may be communicated back (at communication 26) to said input device 1a to create a feedback loop such that said outcome time 13, and deviations thereof, may be known to said input device 1a.

Figure 4:
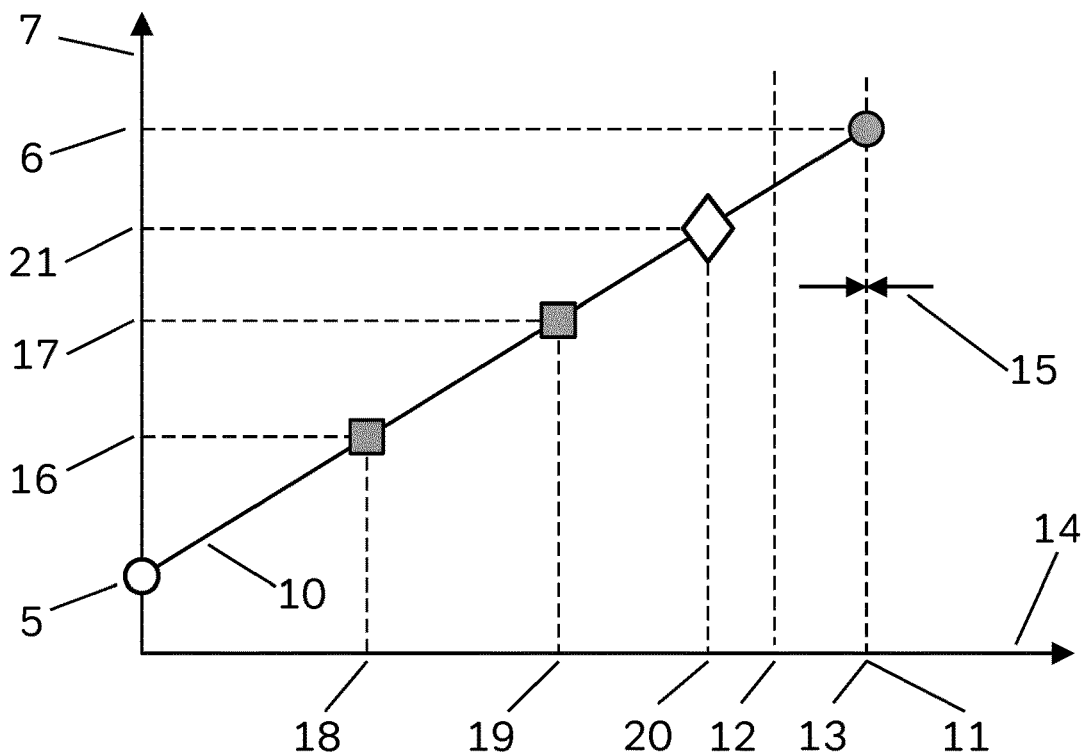
FIG. 4 shows a position versus time plot of the improved system according to an embodiment of the present invention shown in FIG. 3.

FIG. 4 shows a plot of the variation of the detection element's position 7 against time 14 to show a reduction in latency achieved by the system shown in FIG. 3. The said detection element 4 traverses a path 10 from the starting position 5 to the actuation point 6 at time 11. Whilst said actuator 2 traverses said path 10, a first timestamp 18 is recorded when said detection element's position equals the first pre-actuation location 16 and a second timestamp 19 is recorded when said detection element's position equals the second pre-actuation location 17. A trigger event is then transmitted at time 20 such that said trigger event is received by the output device 23 at time 12 before said detection element's position equals the actuation point 6 at time 11. Furthermore, a time of sending said trigger event may be adjusted such that the time at which said output device 23 processes said trigger event to produce the desired outcome 24 at time 13 equals time 11, thus the latency 15 (which is the difference in time between time 13 and time 11) may be zero.

One means of determining the time at which to send the trigger event corresponding to the transition of the input device from the inactive state to the active state is to calculate the velocity (speed and direction) of said input device's detection element from the position of said detection element at two or more pre-actuation locations and the corresponding timestamps at these said two or more pre-actuation locations.

In embodiments where only two pre-actuation locations are available with positions $p_1$ and $p_2$ (16 and 17 in FIG. 4) with respective timestamps $t_1$ and $t_2$ (18 and 19 in FIG. 4), the velocity, v, may be calculated according the following equation:

$$v = \frac{(p_2 - p_1)}{(t_2 - t_1)}$$

In embodiments where a plurality of pre-actuation locations is available with positions $p_n$ at respective timestamps $t_n$, the velocity, v, may be calculated using averaging, filtering, or similar methods. Such a method of calculating the velocity has several advantages over other methods: it does not assume a linear velocity profile as is used for a two-point measurement method but allows changes in velocity throughout the range of movement of the detection element to be detected thus measured values of velocity are more representative of the true velocity of said detection element thus making the adjustments to the latency more accurate.

One example filtering procedure is as follows, where $p_i$ and $t_i$ are the position and respective timestamp of the detection element at the $i^{th}$ pre-actuation location, $v_i$ is the estimated velocity at said $i^{th}$ pre-actuation location, $\Delta v_i$ is the change in estimated velocity since the previous measurement, $\alpha_i$ is a filtering coefficient and k is a constant:

$$v_i = \frac{p_i - p_{i-1}}{t_i - t_{i-1}}$$

$$\Delta v_i = v_i - v_{i-1}$$

$$\alpha_i = k \times |\Delta v_i|$$

The filtered velocity, $\bar{v}_i$, may then be calculated according to the following equation:

$$\bar{v}_i = \alpha_i \Delta \Delta v_i + (1 - \alpha_i) \times \bar{v}_{i-1}$$

The filtering coefficient, $\alpha_i$, thus depends on magnitude of $\Delta v_i$ and may be constrained to a range of values to avoid overflow/underflow of $\bar{v}_i$. Such a method, which may be implemented in the digital domain, can provide improved resolution because of the filtering, which is especially important for a very slowly moving detection element, without significantly compromising the time response for a fast-moving detection element.

In some embodiments the two or more pre-actuation locations correspond to known positions. Two or more timestamps, $t_n$, are obtained corresponding to each time at which the detection element's position equals said pre-actuation locations. In such cases the trigger event may be sent at a calculated trigger time $t_{trig}$, 20 in FIG. 4, to compensate for a latency of $t_{latency}$ whereby $t_{trig}$ is calculated according the following equation where $t_i$ is one of said timestamps corresponding to the position at one of said pre-actuation locations $p_i$:

$$t_{trig} = t_i + \frac{(p_{actuation} - p_i)}{v} - t_{latency}$$

In some embodiments the two or more pre-actuation locations are determined by measuring the position of the detection element at known times. In such cases the trigger event may be sent when the detection element's position equals a trigger threshold, 21 in FIG. 4, whereby said trigger threshold $p_{trig}$ is a position of the detection element that compensates for a latency of $t_{latency}$. The trigger threshold $p_{trig}$ may be calculated according to the following equation, where $p_{actuation}$ is the actuation point 6:

$$p_{trig} = p_{actuation}(v \times t_{latency})$$

Figure 9:
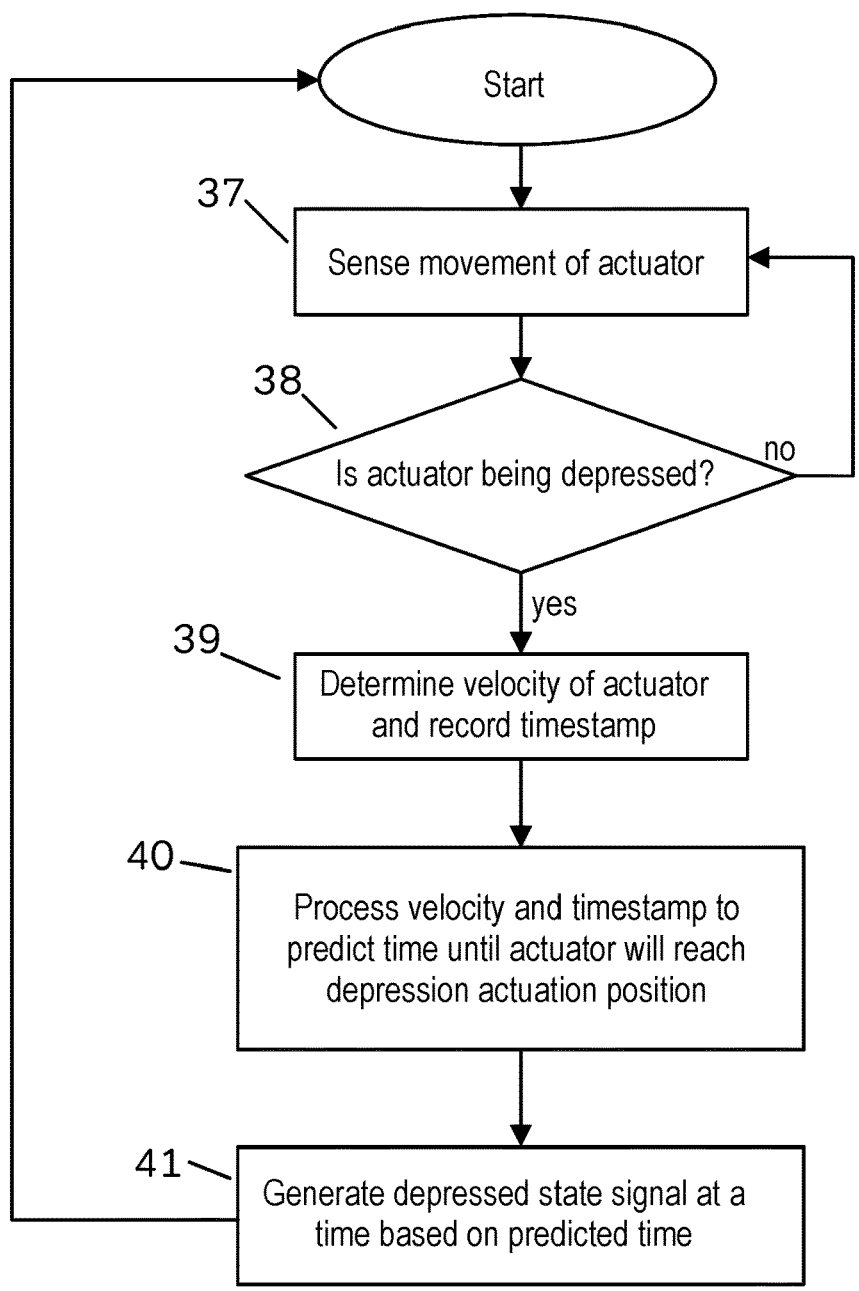
FIG. 9 shows a flowchart to describe a method of providing a depressed state signal from a keyboard or button according to an embodiment of the present invention.

FIG. 9 summarises a method of providing a depressed state signal from a keyboard or button. The method may comprise sensing movement of an actuator of the keyboard or button 37. The method may also comprise determining, during depression 38 of the actuator, a velocity of the actuator at a depression sense position of the actuator and at a first time 39. The method may also comprise processing the determined velocity to predict when the actuator will reach a second depression sense position of the actuator at a later point during depression of the actuator 40. The method may also comprise generating the depressed state signal with a timing based on the prediction of when the actuator will reach the second depression sense position 41.

Figure 10:
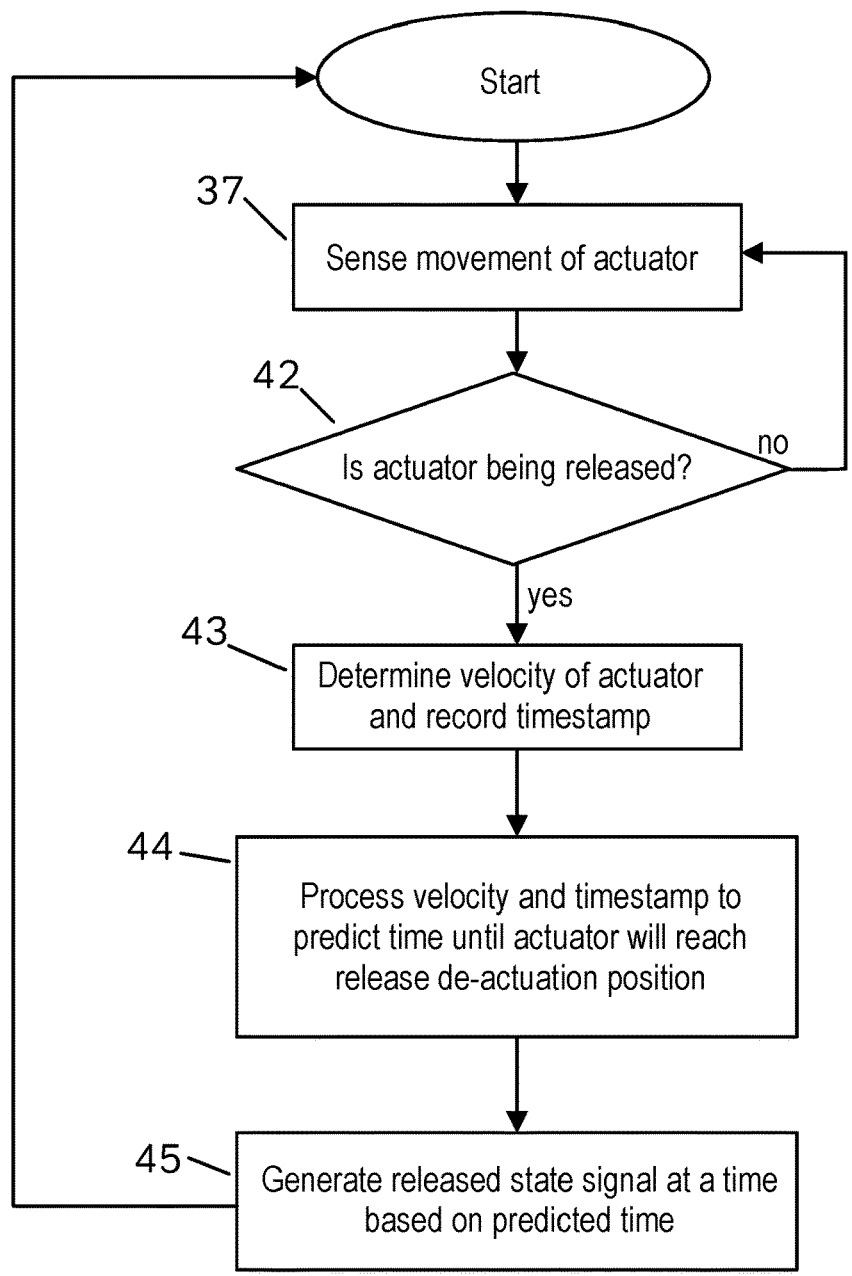
FIG. 10 shows a flowchart to describe a method of providing a released state signal from a keyboard or button according to an embodiment of the present invention.

FIG. 10 summarises a method of providing a released state signal from a keyboard or button. The method may comprise sensing movement of an actuator of the keyboard or button 37. The method may also comprise determining, during release 42 of the actuator, a velocity of the actuator at a release sense position of the actuator and at a first release time 43. The method may also comprise processing the determined velocity to predict when the actuator will reach a second release sense position of the actuator at a later point during release of the actuator 44. The method may also comprise generating the released state signal with a timing based on the prediction of when the actuator will reach the second release sense position 45.

Figure 11:
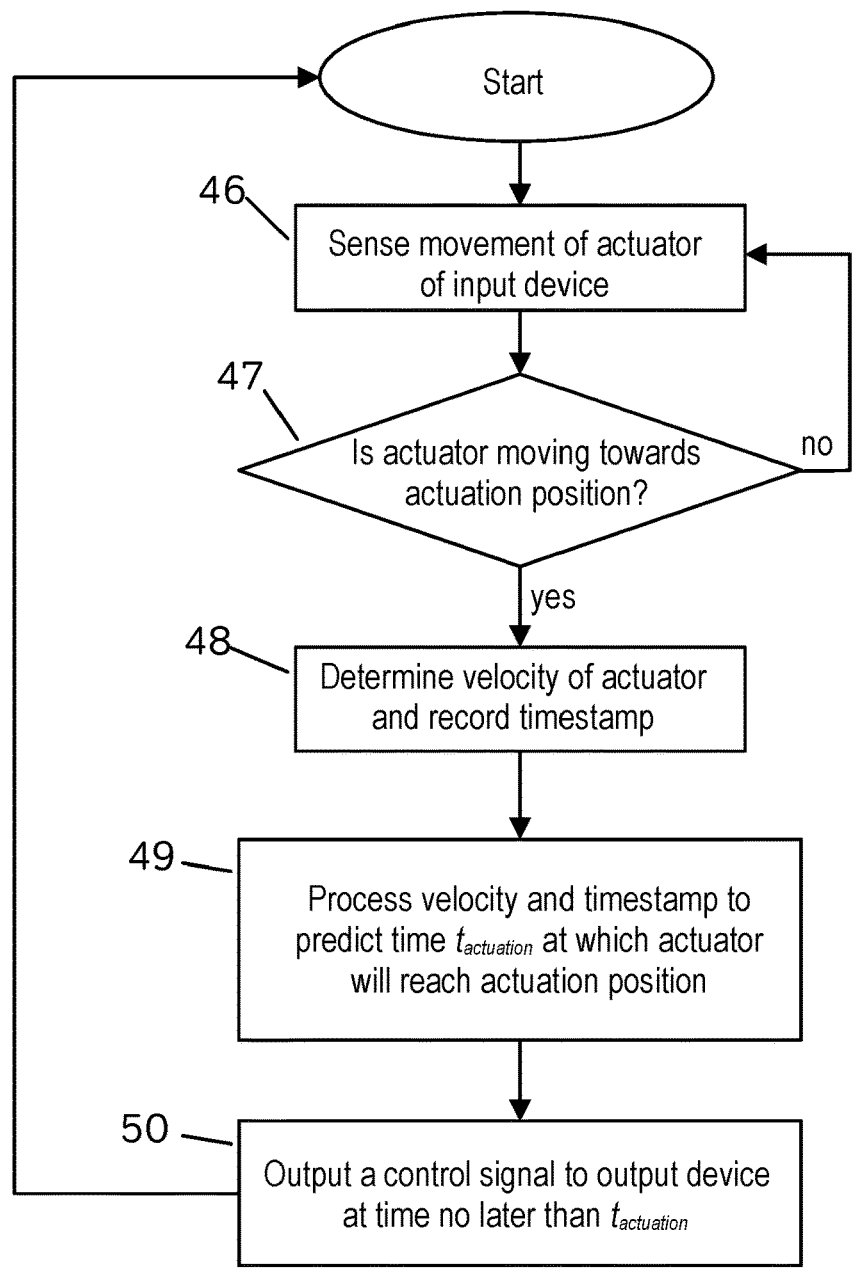
FIG. 11 shows a flowchart to describe a method of controlling an action of an output device in response to an actuator of an input device reaching an actuation position according to an embodiment of the present invention.

FIG. 11 summarises a method of controlling an action of an output device in response to an actuator of an input device reaching an actuation position. The method may comprise sensing movement of the actuator 46. The method may also comprise determining a velocity of the actuator by processing a signal representing the sensed movement 47, 48. The method may also comprise processing the determined velocity 49 to output a control signal to the output device, in particular at an output time no later than a time when the actuator reaches the actuation position 50.

Figure 5:
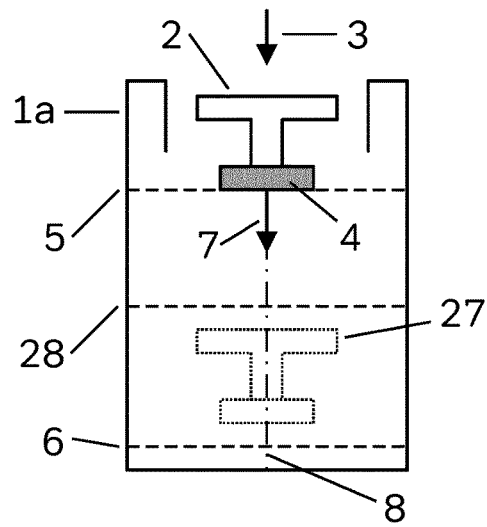
FIG. 5 shows a system with a deactivation point which limits rate of retrigger by adding retrigger latency.

FIG. 5 shows a deactivation point 28 to which the detection element 4 returns before the input device 1a is transitioned from the active state to the inactive state. While said input device 1a is in said active state and the actuator 2 is in the intermediate position 27 further trigger signals are not permitted, thus said latency of retriggering is increased because further trigger signals are not permitted until the position of said detection element 4 returns to said deactivation point.

Figure 6:
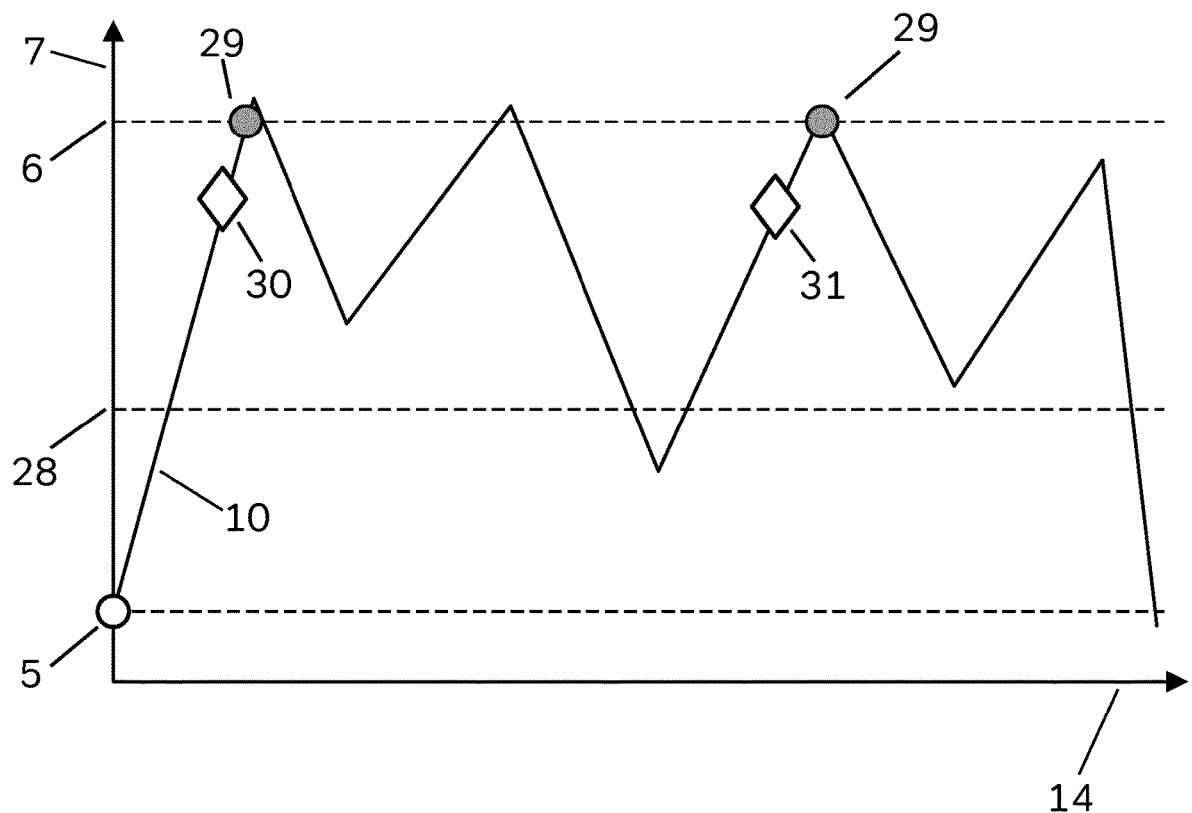
FIG. 6 shows a position versus time plot of the system shown in FIG. 5 to illustrate the source of retrigger latency.

This is shown in more detail in FIG. 6 which plots the variation of the detection element's position 7 against time 14 whereby said detection element 4 traverses a path 10 originating at the starting position 5. Trigger events 30 and 31 are transmitted before said detection element's position equals the actuation point 6, according to aforementioned embodiments of the present invention.

Figure 7:
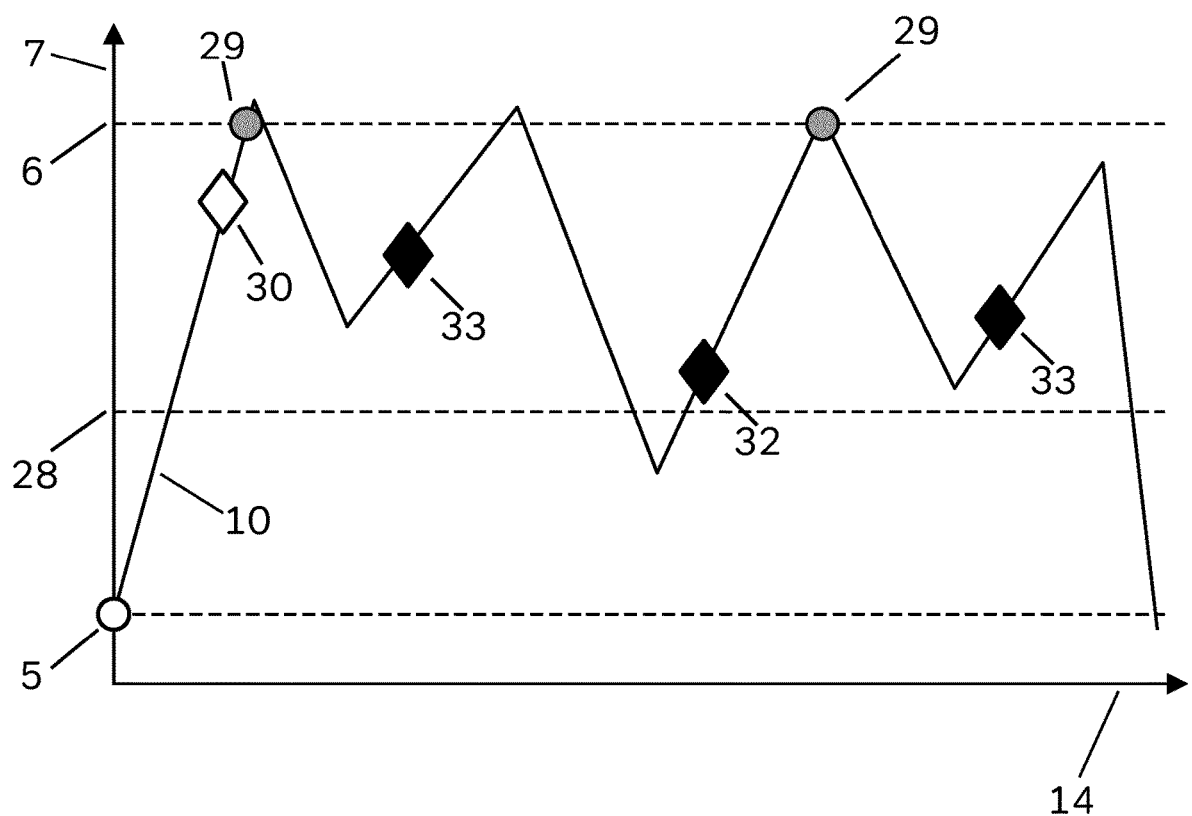
FIG. 7 shows a position versus time plot of an improved system according to an embodiment of the present invention to illustrate compensation for retrigger latency.

In further embodiments, the latency of retriggering can be compensated. Refer to FIG. 7, with comparison to FIG. 6, which shows the effect of such compensation of said latency of retriggering. The first trigger event 30 in FIG. 7 occurs at the same time as the same said first trigger event 30 in FIG. 6. However, the second retrigger event 32 of FIG. 7 occurs sooner, and thus with lower latency, compared to the second retrigger event 31 of FIG. 6. Moreover, retrigger events that were not possible in FIG. 6 may now be detected as shown in FIG. 7 as further retrigger event(s) 33.

Figure 8:
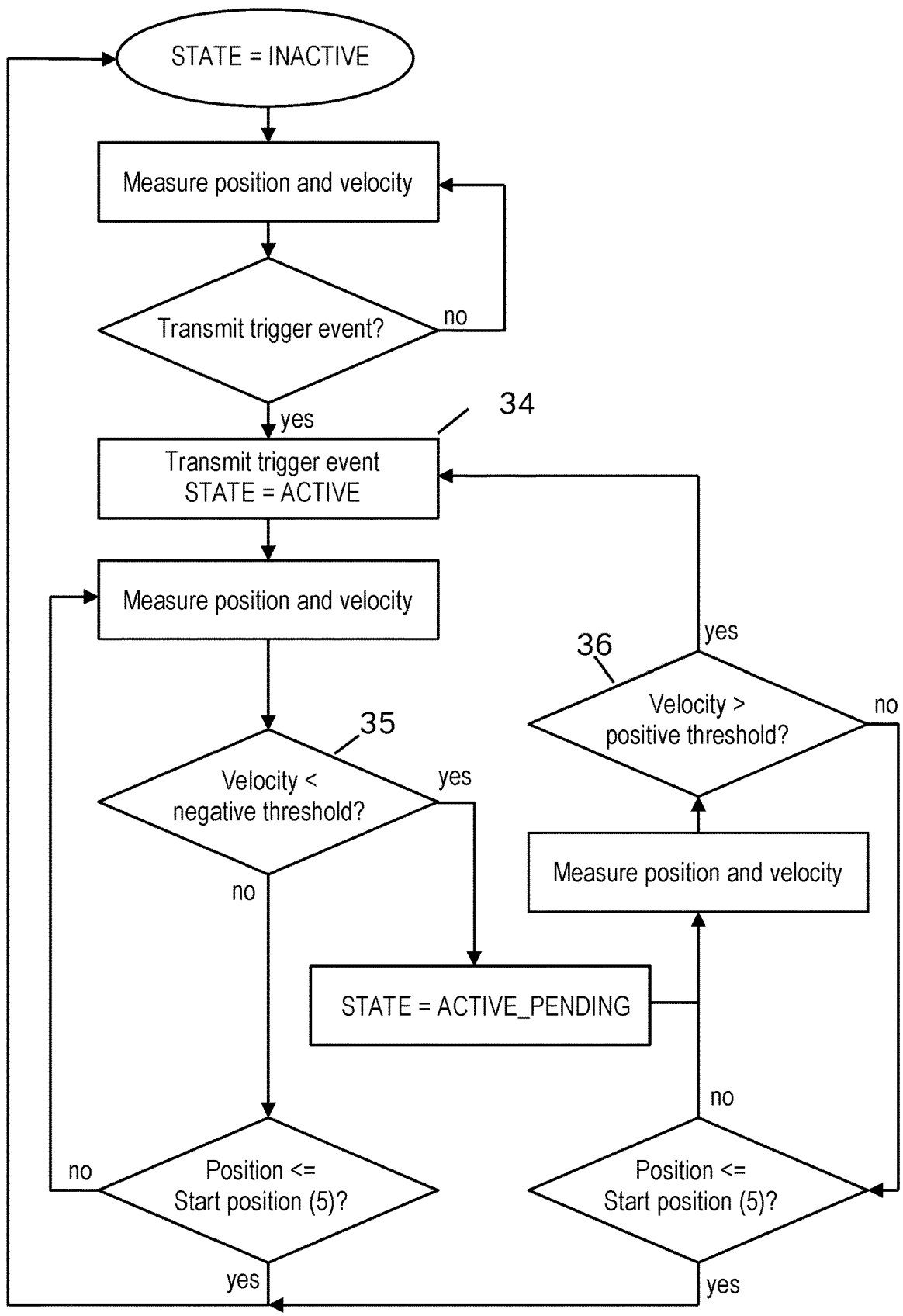
FIG. 8 shows a flowchart to describe an algorithm used to implement the compensation for retrigger latency shown in FIG. 7.

In some implementations this compensation of retriggering latency may be implemented by the algorithm summarised in FIG. 8. Initially the input device is in the INACTIVE state and transitions to the ACTIVE state when a trigger event has been transmitted 34. While in the ACTIVE state another trigger event is not transmitted. If the velocity of the detection element is negative (i.e., said detection element is moving back towards the start position) and has a large enough magnitude (i.e., velocity<negative threshold, 35) the state transitions to the ACTIVE_PENDING state which does permit another trigger event to be transmitted (a retrigger) without the detection element's position having to first return to the start position conditional upon the velocity of said detection element being positive (i.e., said detection element is moving away from the start position) with a large enough magnitude (i.e., velocity>positive threshold, 36), whereupon another trigger event is transmitted and the state transitions to the ACTIVE state 34. By optimising the said negative threshold of velocity and said positive threshold of velocity for a particular system it is possible to: minimise said retriggering latency, maximise detection of retriggers and minimise the probability of false detections of retriggers.

Figure 12:
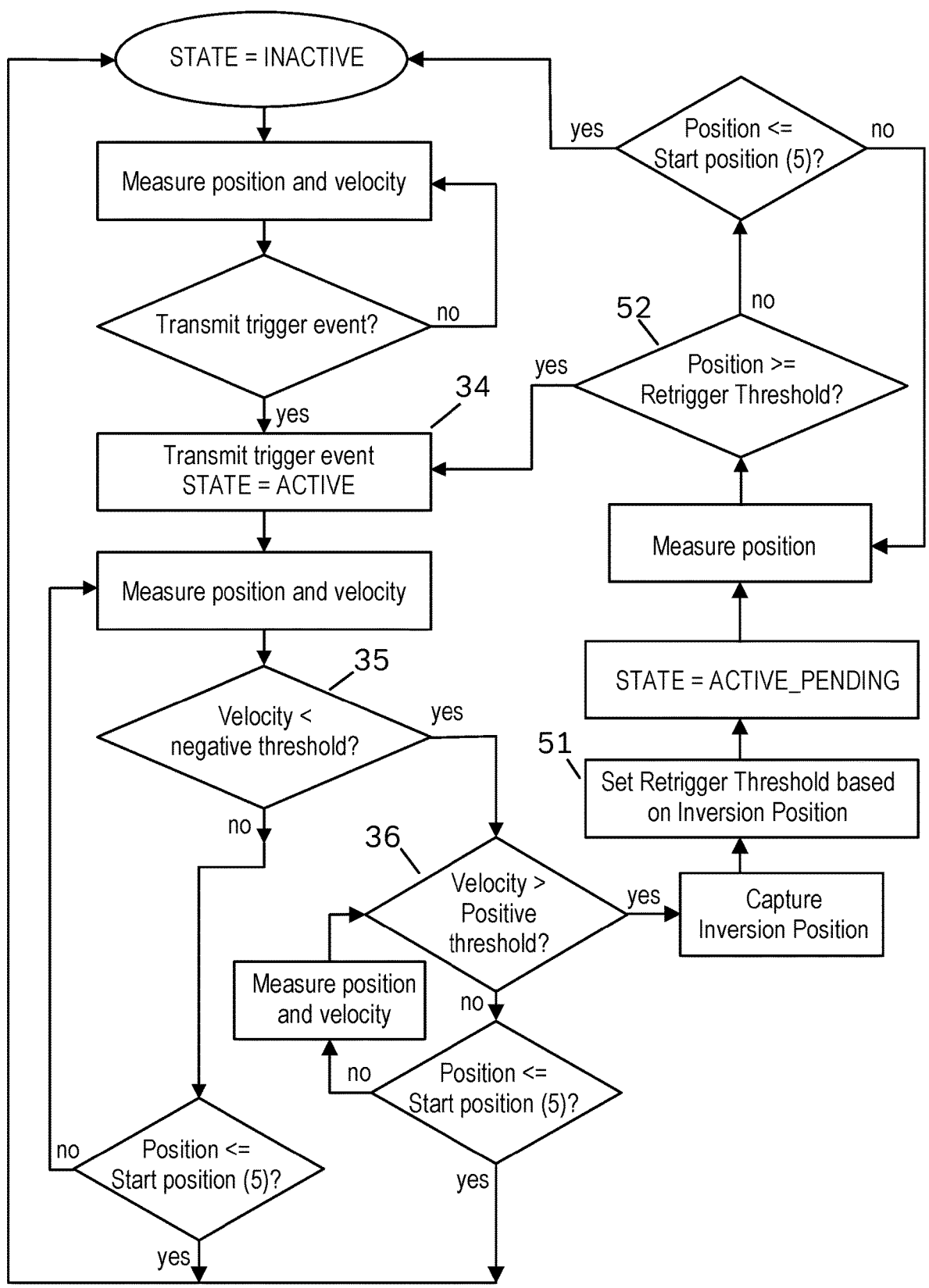
FIG. 12 shows a flowchart to describe an algorithm used to implement the compensation for retrigger latency shown in FIG. 7.

In embodiments, the compensation of retriggering latency may be implemented by a process summarised in FIG. 12. The process of FIG. 12 is in some ways similar to the first algorithm summarised in FIG. 8 when the state transitions to the ACTIVE state. In the process of FIG. 12, an inversion position is detected whereby the position of the detection element transitions from moving towards the start position (i.e., velocity<negative threshold, 35) to moving away from the start position (i.e., velocity>positive threshold, 36) and at this time a retrigger threshold is set 51 as a position offset from said inversion position and the state transitions to the ACTIVE_PENDING state. Thereafter, when the position of said detection element exceeds said retrigger threshold 52 another trigger event is transmitted and the state transitions to the ACTIVE state 34.

In embodiments, the compensation of retriggering latency may be implemented by combining the algorithms summarised in FIG. 8 and FIG. 12 whereby the decision to transmit the retrigger event uses both a position-based threshold and a velocity-based threshold.

In the described embodiments, the actuator may comprise the detection element. For example, the detector element may form an integral unit with the actuator, the detector element may be contained within a casing of the actuator, the detection element may be a section of the actuator.

Although some embodiments have been described with reference to two pre-actuation locations, embodiments of the invention may operate by determining only a single pre-actuation location. For example, embodiments of the present invention may operate by determining an instantaneous velocity of the actuator at a single position. As an example, determining an instantaneous velocity of the actuator at a single position could be achieved by processing a rate of change of a signal obtained from a sensor configured to sense movement of the actuator.

Features of the methods and systems which have been described or depicted herein in combination e.g. in an embodiment, may be implemented separately or in sub-combinations. Features from different embodiments may be combined. Thus each feature disclosed or illustrated in the present specification may be incorporated in the invention, whether alone or in any appropriate combination with any other feature disclosed or illustrated herein. Method steps should not be taken as requiring a particular order e.g. that in which they are described or depicted, unless this is specifically stated. A system may be configured to perform a task by providing processor control code and/or dedicated or programmed hardware e.g. electronic circuitry to implement the task.

Aspects of the method and system have been described in terms of embodiments but these embodiments are illustrative only and that the claims are not limited to those embodiments. Those skilled in the art will be able to make modifications and alternatives in view of the disclosure which are contemplated as falling within the scope of the claims.

The invention claimed is:

1. A method of providing a depressed state signal from a keyboard or button having a predefined pre-actuation position and a predefined actuation position of an actuator of the keyboard or button, the method comprising:
   sensing movement of the actuator of the keyboard or button;
   determining, when the actuator reaches the predefined pre-actuation position during depression of the actuator, a velocity of the actuator;
   processing the determined velocity to calculate a trigger position between the predefined pre-actuation position and the predefined actuation position, wherein the calculated trigger position is different from the predefined pre-actuation position and the predefined actuation position; and
   generating the depressed state signal when the actuator reaches the calculated trigger position such that a latency between when the actuator reaches the predefined actuation position and an action occurring in response to the generated depressed state signal is substantially zero or a negative latency.

2. The method of claim 1,
   wherein the trigger position is calculated based on the velocity of the actuator and a latency value of the keyboard or button.

3. The method of claim 1, wherein the step of determining the velocity comprises determining an average or filtered velocity.

4. The method of claim 3, wherein the velocity is a filtered velocity, and wherein the filtered velocity is based on a filtering coefficient, the filtering coefficient related to a magnitude of the velocity.

5. The method of claim 4, wherein the filtering coefficient is constrained to a pre-determined range of values to avoid overflow or underflow of the filtered velocity.

6. The method of claim 1,
   wherein the movement of the actuator is between a first depression or release sense position, corresponding to the predefined pre-actuation position, and a second depression or release sense position, corresponding to the predefined actuation position, and
   wherein the keyboard or button is configured to perform the action when the actuator reaches the second depression or release sense position.

7. A method of controlling an action of an output device in response to an actuator of an input device moving away from a first predefined pre-actuation position to reach a second predefined actuation position, the method comprising:
   sensing a movement of the actuator;
   determining a velocity of the actuator by processing a signal representing the sensed movement;
   processing the determined velocity to calculate a trigger position for generating a control signal of the actuator, the trigger position being located between the predefined pre-actuation position and the predefined actuation position and different from the predefined pre-actuation position and the predefined actuation position; and
   outputting the control signal to the output device at an output time corresponding to when the actuator reaches the calculated trigger position and no later than a time when the actuator reaches the actuation position, such that a time delay between the actuator reaching the predefined actuation position and the action of the output device, occurring based on the outputted control signal, is reduced.

8. The method of claim 7, wherein the input device is a keyboard or button, the method further comprising providing a depressed or released state signal from the keyboard or button, where:
   determining the velocity of the actuator comprises, during depression or release of the actuator, determining the velocity of the actuator at a first depression or release sense position, corresponding to the predefined pre-actuation position of the actuator, and at a first time; and
   processing the determined velocity to output the control signal comprises:
      processing the determined velocity to predict when the actuator will reach a second depression or release sense position, corresponding to the predefined actuation position of the actuator, at a later time during depression or release of the actuator; and
      generating the depressed or released state signal with a timing based on the prediction of when the actuator will reach the second depression or release sense position.

9. The method of claim 8, wherein the keyboard or button controls the action of the output device in response to the actuator reaching the second depression or release sense position, the method further comprising:

obtaining an indication of a latency value of the output device; and
wherein the timing is further based on the latency value such that the time delay between the actuator reaching the second depression or release sense position and the action occurring is reduced.

10. The method of claim 9, the method further comprising determining the latency value by:
receiving an indication of a depression time or a release time at which the actuator reaches the second depression or release sense position;
receiving an indication of an action time, wherein the action time corresponds to a time when the action is triggered or occurs at the output device; and
determining a difference between the depression time or release time, and the action time.

11. The method of claim 8 further comprising at least one of:
(i) determining, after generating the depressed or released state signal, a first retrigger velocity of the actuator and a subsequent second retrigger velocity of the actuator, and
in response to determining that:
the first retrigger velocity is such that the actuator is moving away from the second depression or release sense position at a first threshold rate; or
the second retrigger velocity is such that the actuator is moving towards the second depression or release sense position at a second threshold rate,
generating a retrigger signal; or
(ii) determining, after generating the depressed or released state signal, an inversion position where the actuator is determined to be moving towards the actuation position; and
in response to determining that the actuator has moved beyond the inversion position by a retrigger threshold distance, generating a retrigger signal.

12. The method of claim 7, wherein at least one of:
(i) the sensing is performed by two or more sensors, each sensor at a fixed position, and the velocity is calculated by processing a time associated with the actuator being sensed at each of the fixed positions and a known distance between each of the two or more sensors; or
(ii) the sensing is performed at a succession of times, wherein the velocity is calculated by processing the sensed position of the actuator at each time of the succession of times.

13. The method of claim 7, wherein calculating the velocity comprises processing three or more sensed positions and associated times to determine an average velocity of the actuator.

14. The method of claim 7 wherein:
processing the velocity comprises:
inputting the determined velocity into a model; and
receiving, from the model, an indication of when the actuator will reach the actuation point; and
the indication is used to determine the output time.

15. The method of claim 7, the method further comprising:
obtaining an indication of a latency value of the output device; and
processing the latency value to output the output signal at the output time.

16. The method of claim 7, wherein the method further comprises:
receiving an indication of an actuation time at which the actuator physically reaches the actuation position;
receiving an indication of an action time, wherein the action time corresponds to a time when the action is triggered or occurs; and
determining a value of a latency between the actuation time and the action time.

17. The method of claim 7 wherein the sensing is performed by two or more sensors, each sensor at a fixed position, and wherein at least one of:
(i) the velocity is determined by processing a time associated with the actuator being sensed at each of the fixed positions and a known distance between each of the two or more sensors; or
(ii) the sensing is performed at a succession of times, wherein the velocity is determined by processing the sensed position of the actuator at each time of the succession of times; or
(iii) determining the velocity comprises processing three or more sensed positions and associated times to determine an average velocity.

18. The method of claim 7 further comprising at least one of:
(i) determining, after outputting the output signal, a second velocity of the actuator and a subsequent third velocity of the actuator, and
in response to determining that:
the second velocity is such that the actuator is moving away from the actuation position at a first threshold rate; or
the third velocity is such that the actuator is moving towards the actuation position at a second threshold rate,
outputting a retrigger control signal to the output device; or
(ii) determining, after outputting the output signal and after the actuator has moved away from the actuation position, an inversion position where the actuator is determined to be moving towards the actuation position; and
in response to determining that the actuator has moved beyond the inversion position by a retrigger threshold distance, outputting a retrigger control signal to the output device.

19. A system for controlling an action of an output device in response to an actuator of the input device moving away from a first predefined pre-actuation position to reach a second predefined actuation position, the system comprising:
the actuator;
a sensor for sensing a movement of the actuator; and
wherein the system is configured to:
determine a velocity of the actuator by processing a signal representing the sensed movement;
process the determined velocity to calculate a trigger position for generating a control signal of the actuator, the trigger position being located between the predefined pre-actuation position and the predefined actuation position and different from the predefined pre-actuation position and the predefined actuation position; and
output the control signal to the output device at an output time corresponding to when the actuator reaches the calculated trigger position and no later than a time when the actuator reaches the actuation position, such that a time delay between the actuator reaching the predefined actuation position and the action of the output device, occurring based on the outputted control signal, is reduced.

20. The system of claim 19, wherein the input device is a keyboard or button, the system configured for providing a depressed or released state signal from the keyboard or button, the system configured to:
  determine the velocity of the actuator by determining, during depression or release of the actuator, the velocity of the actuator at a first depression or release sense position, corresponding to the predefined pre-actuation position of the actuator, and at a first time; and
  process the determined velocity to calculate the trigger position and thereby output the control signal by:
    processing the determined velocity to predict when the actuator will reach a second depression or release sense position, corresponding to the predefined actuation position of the actuator, at a later time during depression or release of the actuator; and
  generating the depressed or released state signal with a timing based on the prediction of when the actuator will reach the second depression or release sense position.

\* \* \* \* \*